(12) United States Patent
Hsiao et al.

(10) Patent No.: US 7,714,445 B2
(45) Date of Patent: May 11, 2010

(54) DYNAMIC RANDOM ACCESS MEMORY WITH AN ELECTROSTATIC DISCHARGE STRUCTURE AND METHOD FOR MANUFACTURING THE SAME

(75) Inventors: Ching-Nan Hsiao, Kaohsiung County (TW); Ying-Cheng Chuang, Taoyuan County (TW); Chung-Lin Huang, Taoyuan County (TW); Shih-Yang Chiu, Taipei (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 0 days.

(21) Appl. No.: 11/951,274

(22) Filed: Dec. 5, 2007

(65) Prior Publication Data

US 2009/0014886 A1  Jan. 15, 2009

(30) Foreign Application Priority Data

Jul. 11, 2007  (TW) ................... 96125182 A

(51) Int. Cl.
*H01L 23/552* (2006.01)
*H01L 21/768* (2006.01)

(52) U.S. Cl. ............................. 257/774; 257/E21.649; 438/629

(58) Field of Classification Search ................. 438/241, 438/258, 682, 396, 586, 970, 592; 257/774, 257/E21.649
See application file for complete search history.

(56) References Cited

U.S. PATENT DOCUMENTS

| | | | | |
|---|---|---|---|---|
| 5,504,362 A | * | 4/1996 | Pelella et al. | 257/357 |
| 5,760,452 A | * | 6/1998 | Terada | 257/386 |
| 5,973,363 A | * | 10/1999 | Staab et al. | 257/347 |
| 5,998,252 A | * | 12/1999 | Huang | 438/241 |
| 6,008,081 A | * | 12/1999 | Wu | 438/210 |
| 6,197,644 B1 | * | 3/2001 | Gardner et al. | 438/279 |
| 6,281,059 B1 | * | 8/2001 | Cheng et al. | 438/200 |
| 6,300,238 B1 | * | 10/2001 | Lee et al. | 438/624 |
| 6,306,760 B1 | * | 10/2001 | Hsu et al. | 438/639 |
| 6,413,822 B2 | * | 7/2002 | Williams et al. | 438/270 |
| 6,420,754 B2 | * | 7/2002 | Takahashi et al. | 257/326 |
| 6,479,343 B1 | * | 11/2002 | Hwang et al. | 438/253 |
| 6,649,508 B1 | * | 11/2003 | Park et al. | 438/618 |
| 7,052,952 B2 | * | 5/2006 | Bae et al. | 438/239 |
| 7,067,417 B2 | * | 6/2006 | Park et al. | 438/637 |
| 7,449,389 B2 | * | 11/2008 | Meister et al. | 438/379 |
| 2002/0094610 A1 | * | 7/2002 | Enomoto et al. | 438/118 |
| 2002/0098687 A1 | * | 7/2002 | Wu | 438/640 |
| 2002/0173094 A1 | * | 11/2002 | Park et al. | 438/241 |
| 2005/0280035 A1 | * | 12/2005 | Lee et al. | 257/208 |

(Continued)

FOREIGN PATENT DOCUMENTS

JP   05055516 A  *  3/1993

*Primary Examiner*—Leonardo Andújar
*Assistant Examiner*—William Harriston
(74) *Attorney, Agent, or Firm*—Winston Hsu

(57) ABSTRACT

The invention provides a dynamic random access memory (DRAM) with an electrostatic discharge (ESD) region. The upper portion of the ESD plug is metal, and the lower portion of the ESD plug is polysilicon. This structure may improve the mechanical strength of the ESD region and enhance thermal conductivity from electrostatic discharging. In addition, the contact area between the ESD plugs and the substrate can be reduced without increasing aspect ratio of the ESD plugs. The described structure is completed by a low critical dimension controlled patterned photoresist, such that the processes and equipments are substantially maintained without changing by a wide margin.

7 Claims, 8 Drawing Sheets

U.S. PATENT DOCUMENTS

| | | | |
|---|---|---|---|
| 2006/0068545 A1* | 3/2006 | Goldbach | 438/256 |
| 2006/0146595 A1* | 7/2006 | Hong et al. | 365/154 |
| 2006/0148168 A1* | 7/2006 | Li et al. | 438/239 |
| 2007/0145485 A1* | 6/2007 | Oh et al. | 257/363 |
| 2007/0212831 A1* | 9/2007 | Inoue et al. | 438/254 |
| 2007/0241380 A1* | 10/2007 | Hasunuma | 257/296 |
| 2007/0278552 A1* | 12/2007 | Clampitt | 257/308 |
| 2008/0080112 A1* | 4/2008 | Lin et al. | 361/56 |
| 2008/0093741 A1* | 4/2008 | Lee | 257/755 |
| 2008/0105912 A1* | 5/2008 | Katsumata et al. | 257/301 |
| 2009/0014886 A1* | 1/2009 | Hsiao et al. | 257/774 |
| 2009/0087544 A1* | 4/2009 | Chen et al. | 427/58 |

* cited by examiner

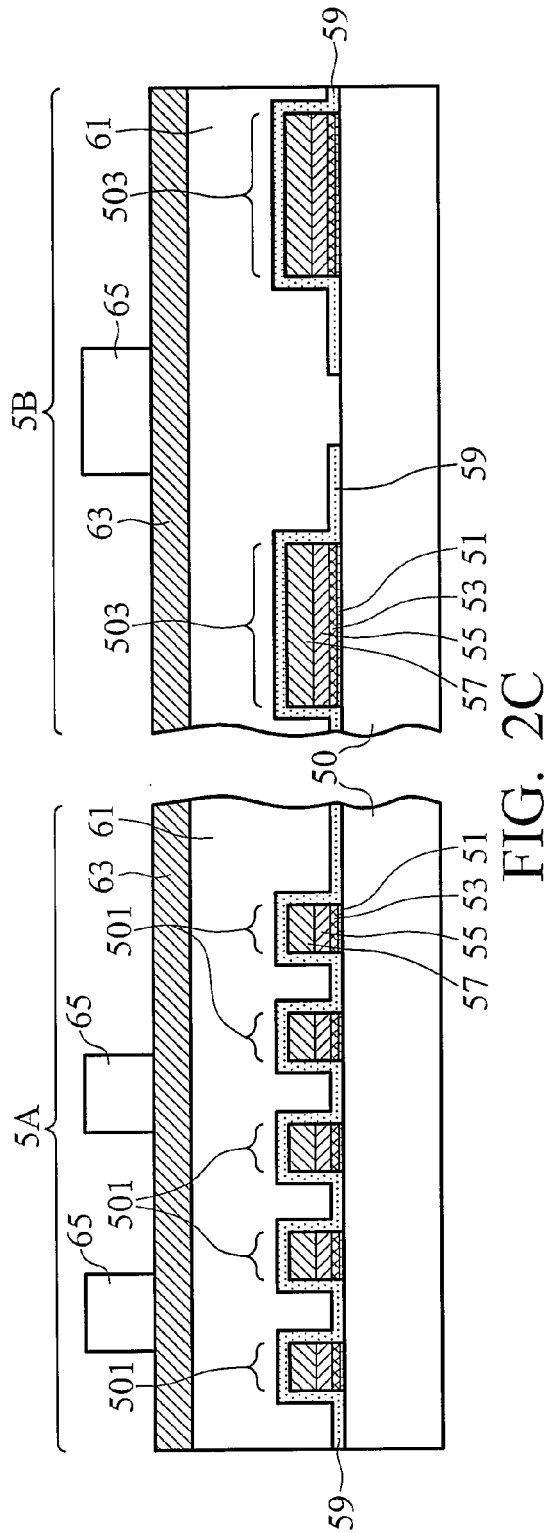
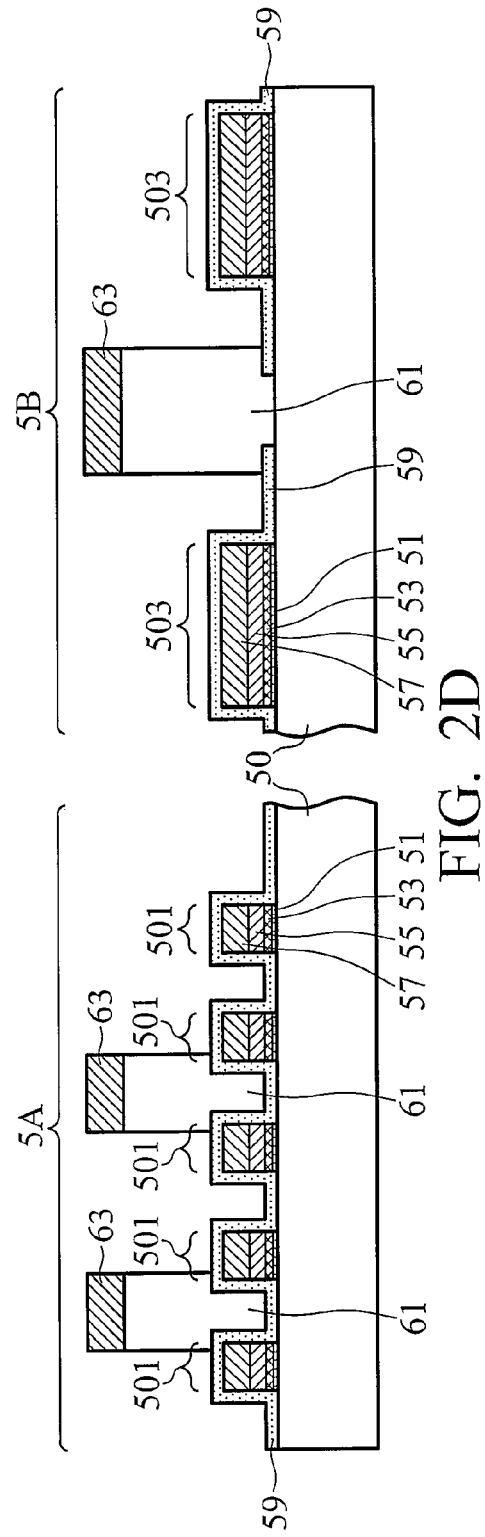
FIG. 2C
FIG. 2D

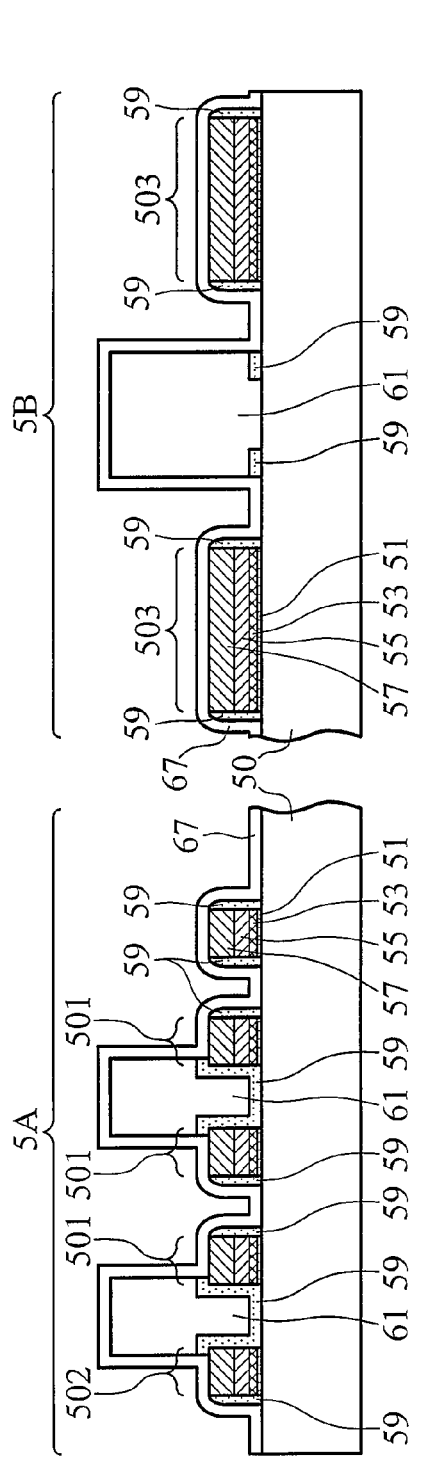
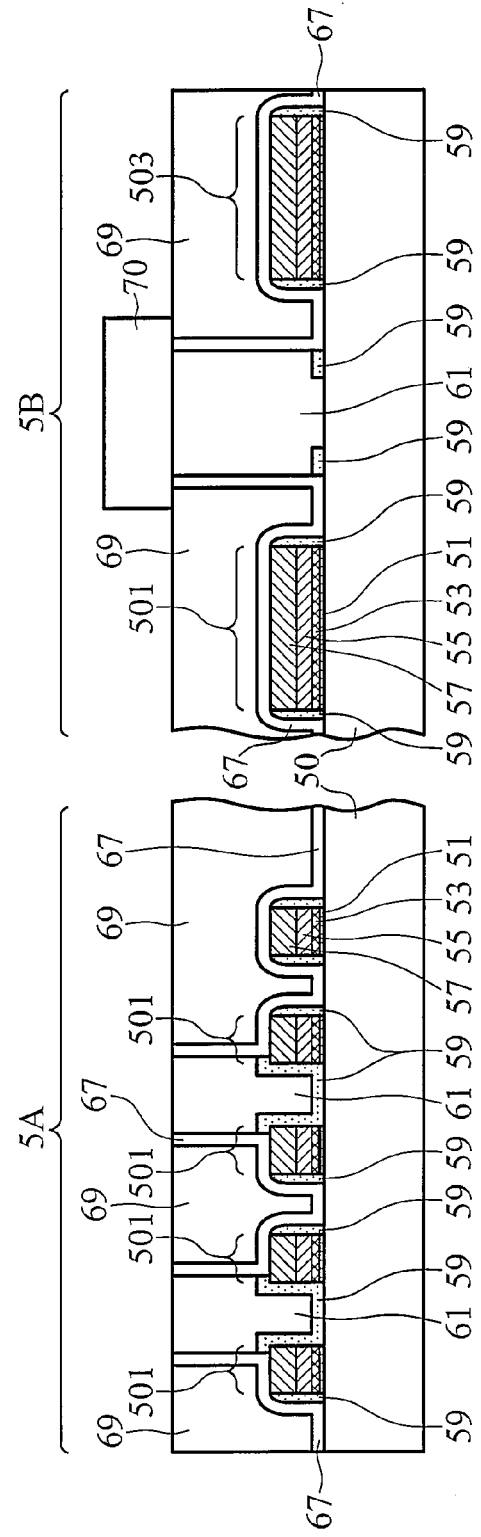
FIG. 2E
FIG. 2F

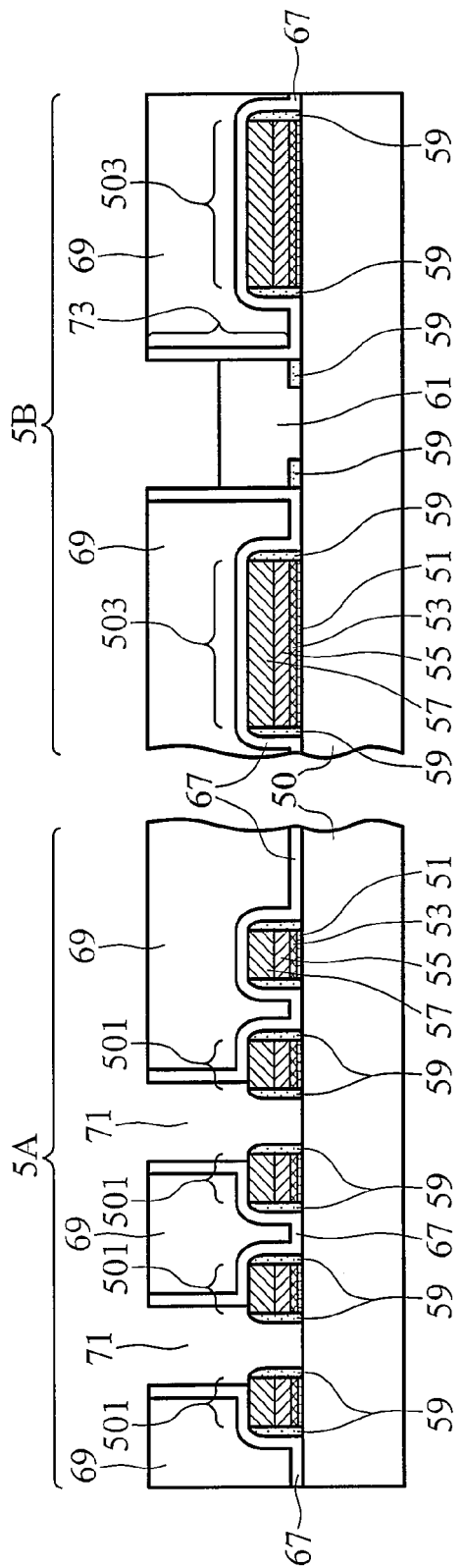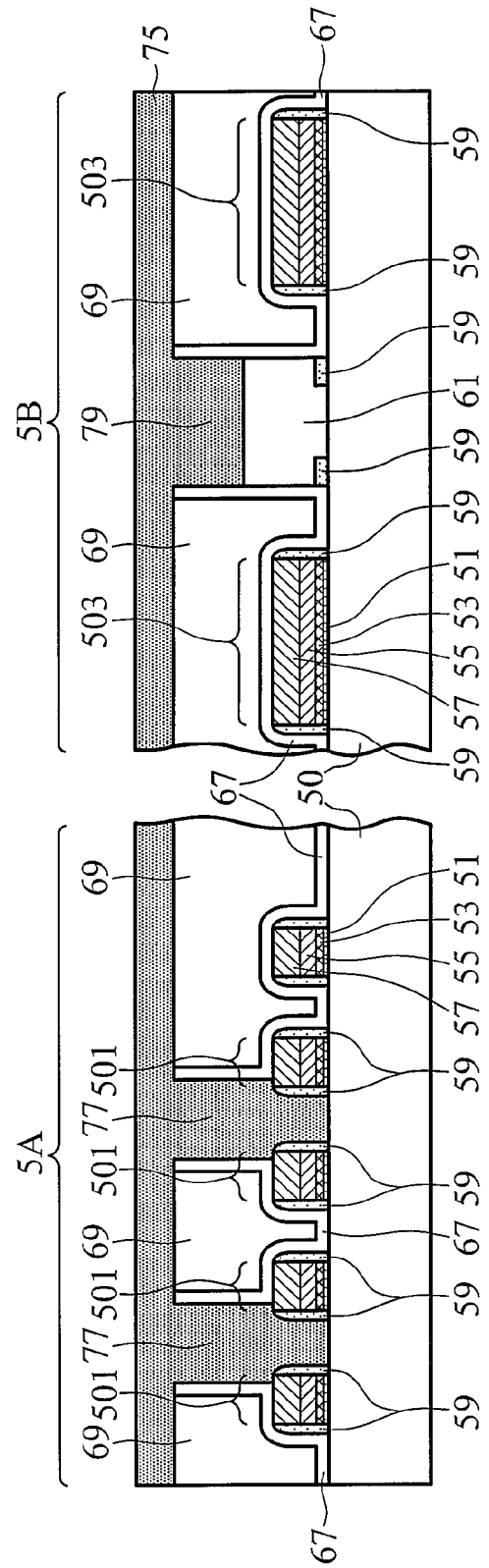

DYNAMIC RANDOM ACCESS MEMORY WITH AN ELECTROSTATIC DISCHARGE STRUCTURE AND METHOD FOR MANUFACTURING THE SAME

BACKGROUND OF THE INVENTION

1. Field of the Invention

The invention relates to a dynamic random access memory and in particular to an electrostatic discharge structure of a dynamic random access memory.

2. Description of the Related Art

For a dynamic random access memory (hereinafter referred to as DRAM), the data storage status is determined by charging or discharging of the array of capacitors on the semiconductor substrate. In general, charging status of a capacitor is represented as "1", and discharging status of a capacitor is represented as "0". If operating voltage and upper/lower electrode plate dielectric constant is fixed, the amount of storage charges is determined by the surface area of the capacitors in DRAM.

Ordinarily, a DRAM has an electrostatic discharge (hereinafter referred to as ESD) region between a periphery region and a device region. The ESD region prevents electrostatic charges from interrupting operations or damaging the DRAM. In general, higher ESD resistance results in less current produced by electrostatic discharge, such that the circuit is protected from large instantaneous electrostatic charges. Reducing the contact area between the plug and the substrate to increase electrostatic resistance without enhancing the plug aspect ratio, and simultaneously improving the mechanism strength of the ESD region are major objectives in the field.

SUMMARY OF THE INVENTION

The invention provides a method for manufacturing a method for manufacturing an electrostatic discharge structure, comprising the steps of providing a substrate having an electrostatic discharge region, wherein the electrostatic discharge region has a plurality of conductive structures; forming an interlayer dielectric layer on top of the substrate; forming a contact hole in the interlayer dielectric layer to exposes part of the substrate, wherein the contact hole is formed between each two of the conductive structures; and forming a conductor in the contact hole and on the top surface of the interlayer dielectric layer, wherein the conductor electrically connects to the substrate.

The invention also provides an electrostatic discharge structure, comprising a substrate having a plurality of conductive structures thereon; an interlayer dielectric layer formed on the substrate, wherein the interlayer dielectric layer has a contact hole between the conductive structures to expose part of the substrate; a sacrificial layer formed in a lower portion of the contact hole; and a conductor in an upper portion of the contact hole and overlying the top surface of the interlayer dielectric layer.

A detailed description is given in the following embodiments with reference to the accompanying drawings.

BRIEF DESCRIPTION OF THE DRAWINGS

The invention can be more fully understood by reading the subsequent detailed description and embodiments with references made to the accompanying drawings, wherein:

FIGS. 2A-2H show serial cross sections of manufacturing a DRAM with an electrostatic discharge structure in an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1A-1H show serial cross sections of manufacturing a DRAM with an electrostatic discharge structure in a comparative embodiment of the invention.

Figure 1A:
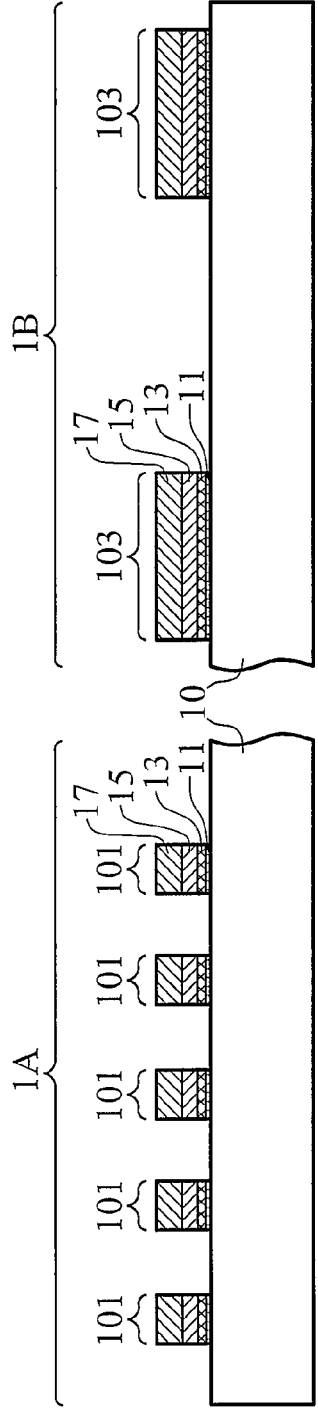
FIGS. 1A-1H show serial cross sections of manufacturing a DRAM with an electrostatic discharge structure in a comparative embodiment of the invention.

As shown in FIG. 1A, a semiconductor substrate 10 is provided. The semiconductor substrate is separated into a device region 1A and an ESD region 1B. A gate oxide layer 11, a polysilicon layer 13, a metal silicide layer 15, and a hard mask layer 17 are subsequently formed on the substrate 10. These stacked layers are then patterned by a lithography process to form conductive structures 101 in the device region 1A and conductive structures 103 in the ESD region 1B. The conductive structures 101 are so-called word lines.

Figure 1B:
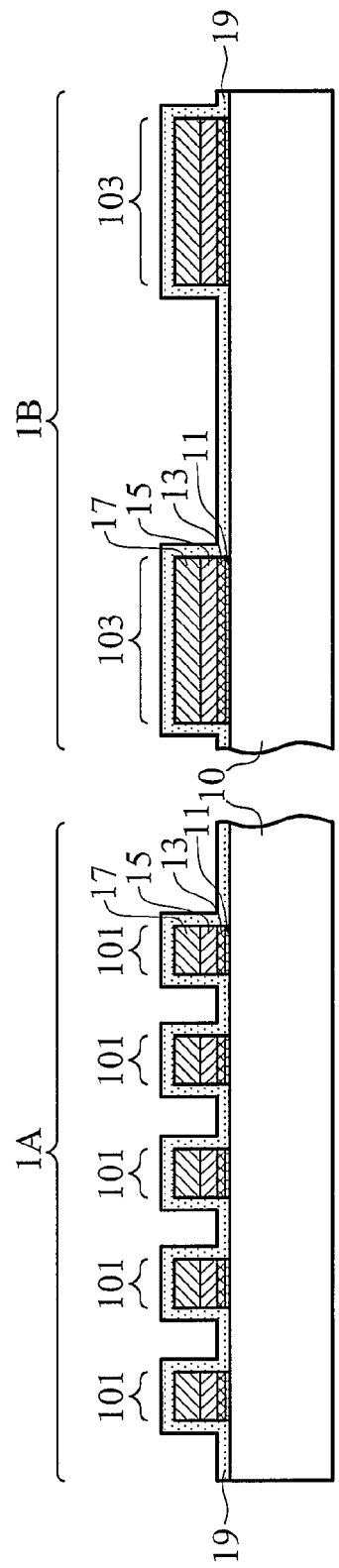

As shown in FIG. 1B, a silicon oxide layer 19 is then comfortably formed on the device region 1A and ESD region 1B.

Figure 1C:
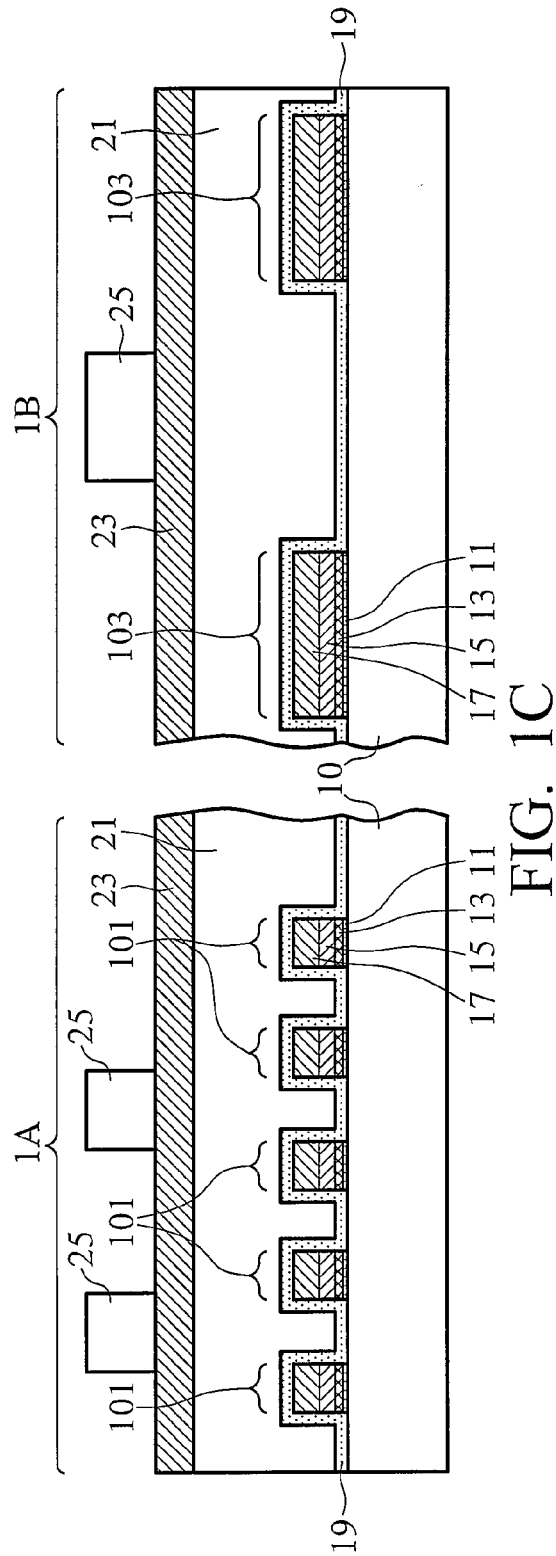

As shown in FIG. 1C, a sacrificial polysilicon layer 21 is blanketly deposited over the silicon oxide layer 19. After planarizing the top surface of the sacrificial polysilicon layer 21, a mask layer 23 is formed overlying the planarized top surface. Subsequently, a patterned photoresist layer 25 is formed to selectively cover the predetermined position for the later formed plugs.

Figure 1D:
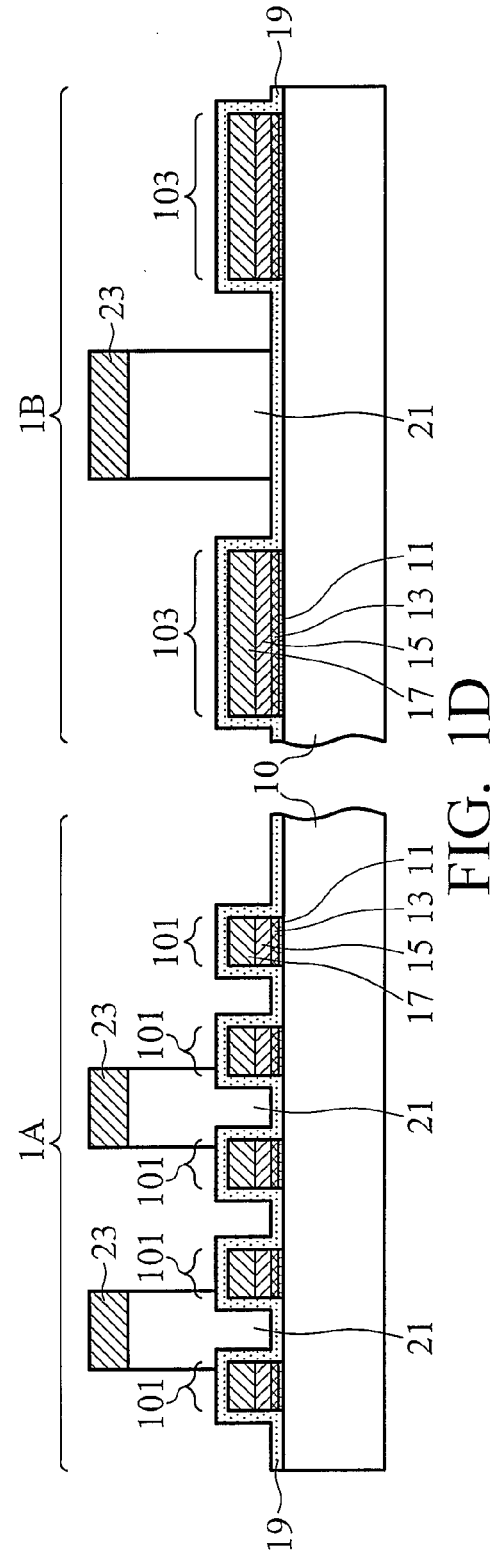

As shown in FIG. 1D, the mask layer 23 and the sacrificial polysilicon layer 21 not protected by the patterned photoresist layer 25 are then removed.

Figure 1E:
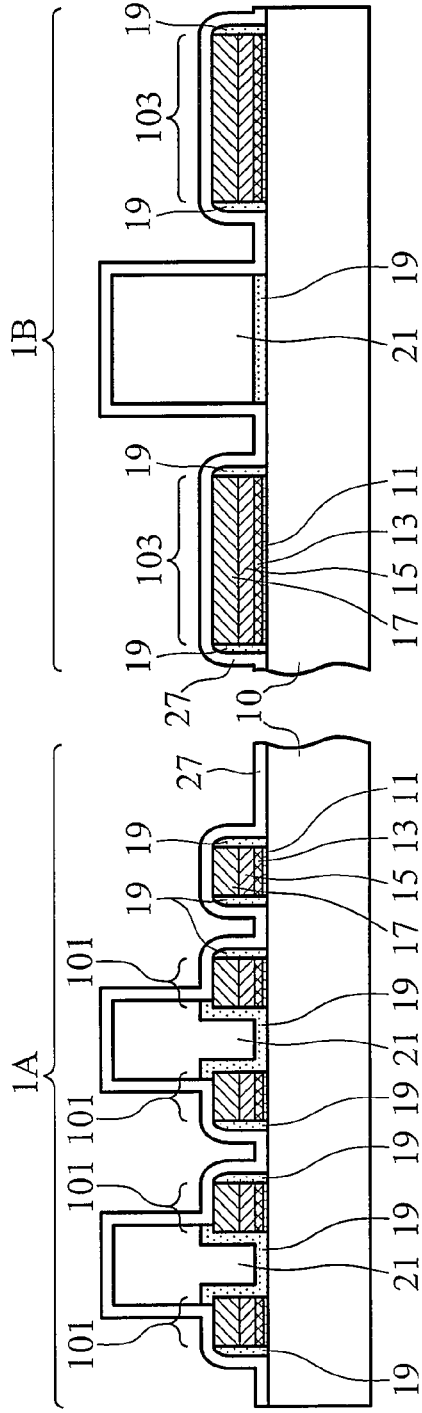

As shown in FIG. 1E, the mask layer 23 and the silicon oxide layer 19 in lateral direction are removed with part of the mask layer 23 remaining, wherein the silicon oxide layer 19 serve as side spacers of the conductive structures 101 and 103. Subsequently, a silicon oxide layer 27 is comfortably formed on the described structure.

Figure 1F:
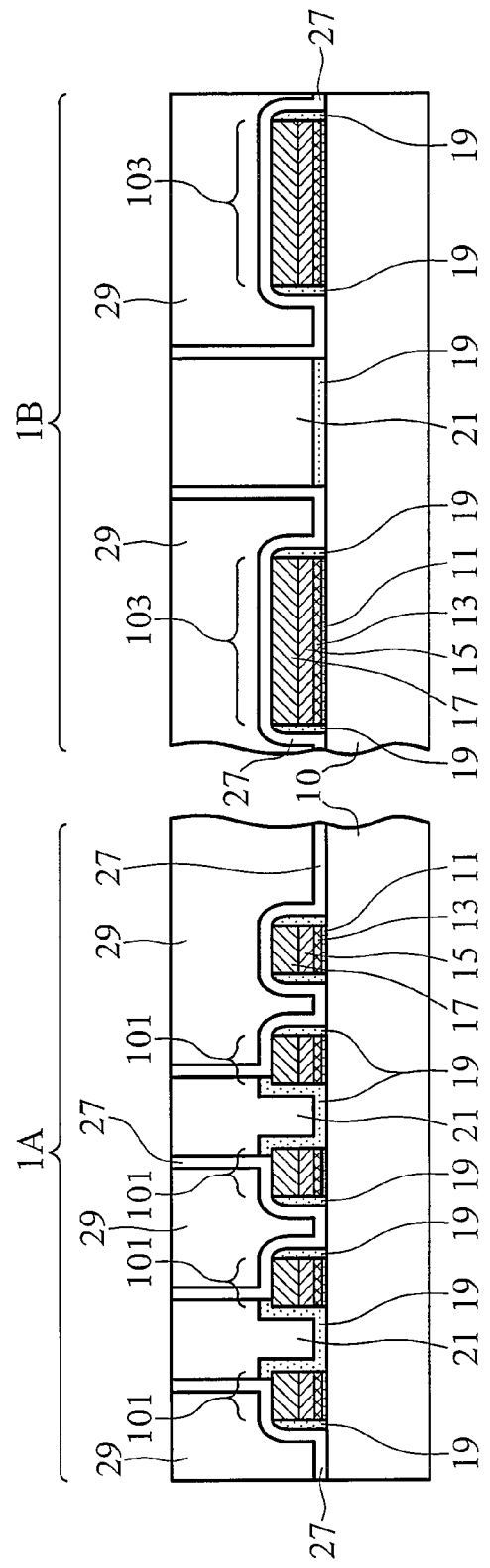

As shown in FIG. 1F, an interlayer dielectric layer 29 is blanketly formed on the silicon oxide layer 27. A chemical mechanical polish (hereinafter CMP) is performed until exposing the sacrificial polysilicon layer 21.

Figure 1G:
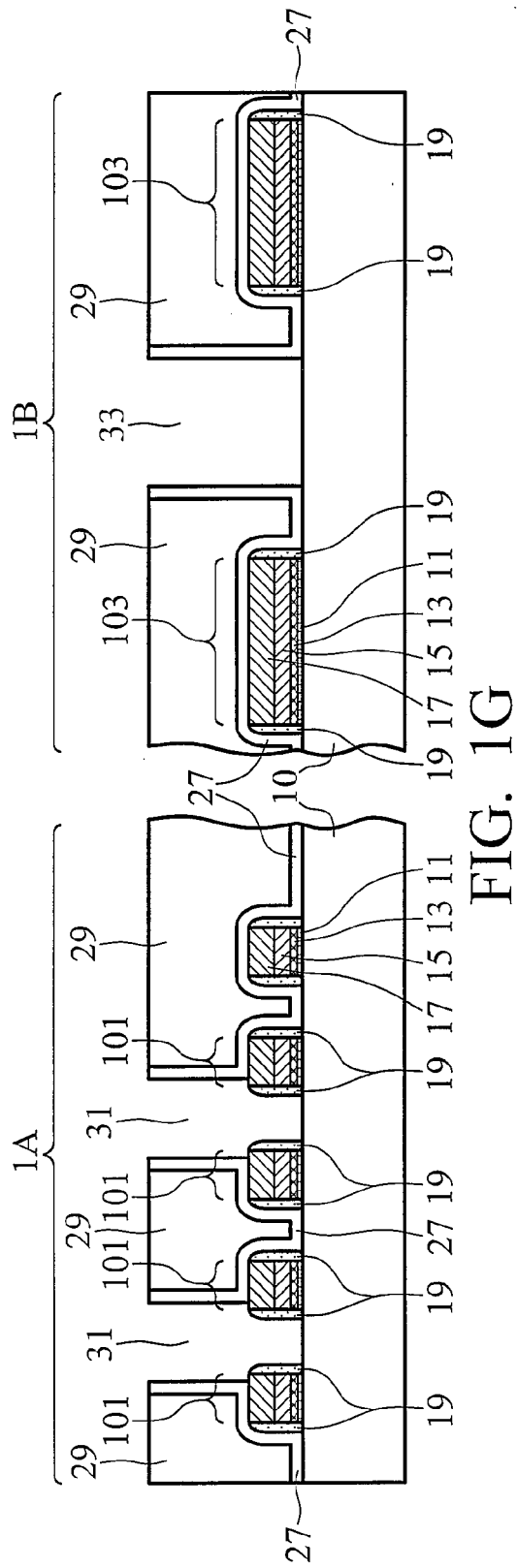

As shown in FIG. 1G, the sacrificial polysilicon layer 21 is removed, and the silicon oxide layer 19 in lateral direction is removed by anisotropic etching such as dry etch. After the processes as shown in FIGS. 1A-1G, the device region 1A has a bit line contact hole 31, and the ESD region 1B has a contact hole 33.

Figure 1H:
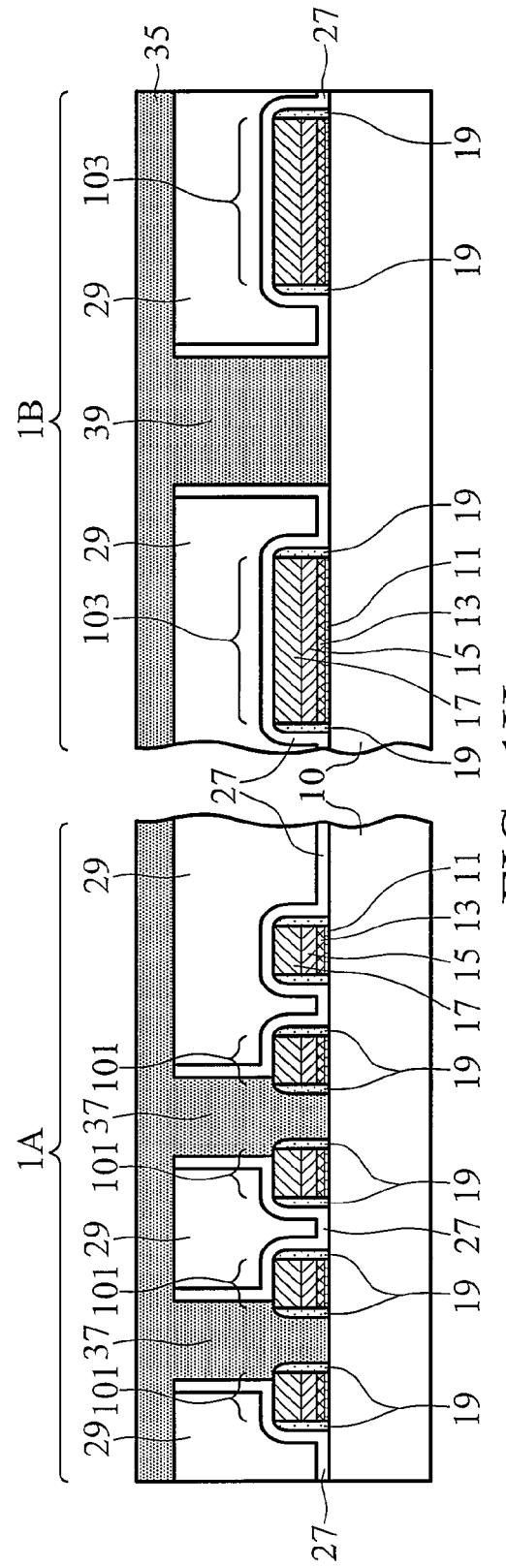

As shown in FIG. 1H, a metal layer 35 is filled into the bit line contact hole 31 and contact hole 33 to form plugs 37 and 39 and covered on the interlayer dielectric layer 29. The metal layer 35 is then planarized and patterned to form bit lines.

The plug 39 in the ESD region 1B has several defects as described below. First, the contact area between the plug 39 and the substrate 10 is similar to the opening area of the plug 39. If a smaller contact area is desired, the opening should be correspondingly be reduced and therefore increasing the aspect ratio of the plug 39. High aspect ratio of the plug 39 makes filling in of the metal layer 39 more difficult, resulting in possible effects such as void, thus, degrading device performance.

Figure 2A:
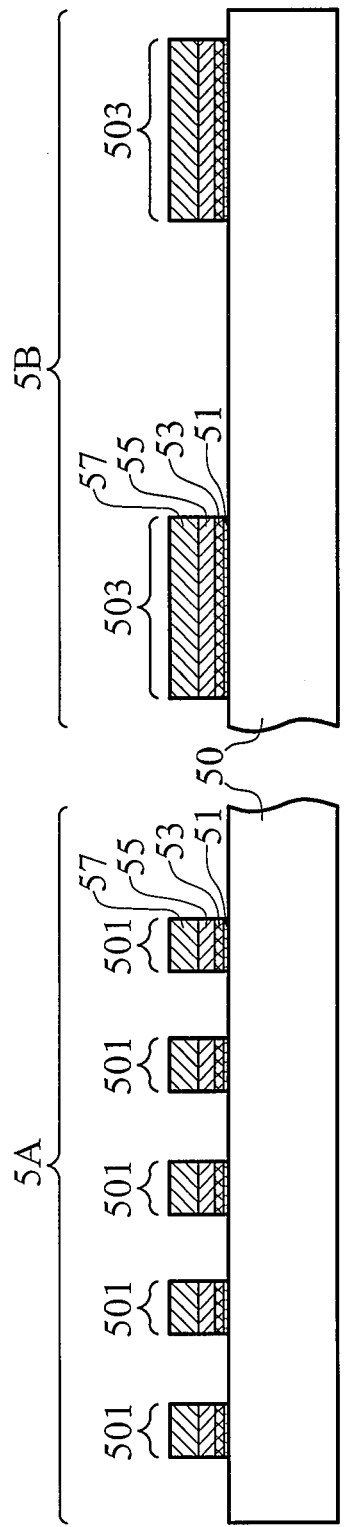

FIGS. 2A-2H show serial cross sections of manufacturing a DRAM with an electrostatic discharge structure in an embodiment of the invention. As shown in FIG. 2A, a semiconductor substrate 50 is provided. The semiconductor substrate can be silicon, silicon on insulator (SOI), germanium silicide, germanium, or the like. In some embodiments of the invention, the substrate 50 is preferably silicon. Similar to the structure in FIG. 1A, the substrate 50 in FIG. 2A is separated into a device region 5A and an ESD region 5B.

A gate oxide layer 51 is then formed on the semiconductor substrate 50. The formation of the gate oxide layer 51 can be divided into two processes, the thermal oxide growth with silicon consumption and the oxide deposition without silicon consumption. The former process places the substrate in oxygen-containing gas to form an oxide layer on the substrate surface. Because the oxide formation consumes silicon, this process is categorized as consumption type oxide growth. The latter process mixes silicon-containing gas and oxygen-containing gas to form silicon oxide on the silicon substrate surface. Subsequently, a polysilicon layer 53 is deposited on the gate oxide layer 51 surface. The general deposition is low temperature chemical vapor deposition (LPCVD). A metal layer (not shown) is deposited on the polysilicon layer 53 and then reacted with the underlying polysilicon layer 53 in high temperature to form a metal silicide layer 55. The un-reacted metal layer is removed. Suitable metal layer includes nickel, cobalt, tungsten, titanium, chromium, or the like. In one embodiment of the invention, the metal layer is tungsten. Subsequently, a hard mask layer 57 is deposited on the metal silicide layer 55. The hard mask 55 can be silicon nitride formed by chemical vapor deposition (CVD).

The described multi layered structure can be patterned by a lithography process to form a plurality of conductive structures 501 and 503 in the device region 5A and the ESD region 5B, respectively. The conductive structures 501 are so-called word lines. Note that the distance between the conductive structures 501 is narrower than the distance between the conductive structures 503. In addition, the size of the conductive structures 503 is larger than the conductive structures 501.

Figure 2B:
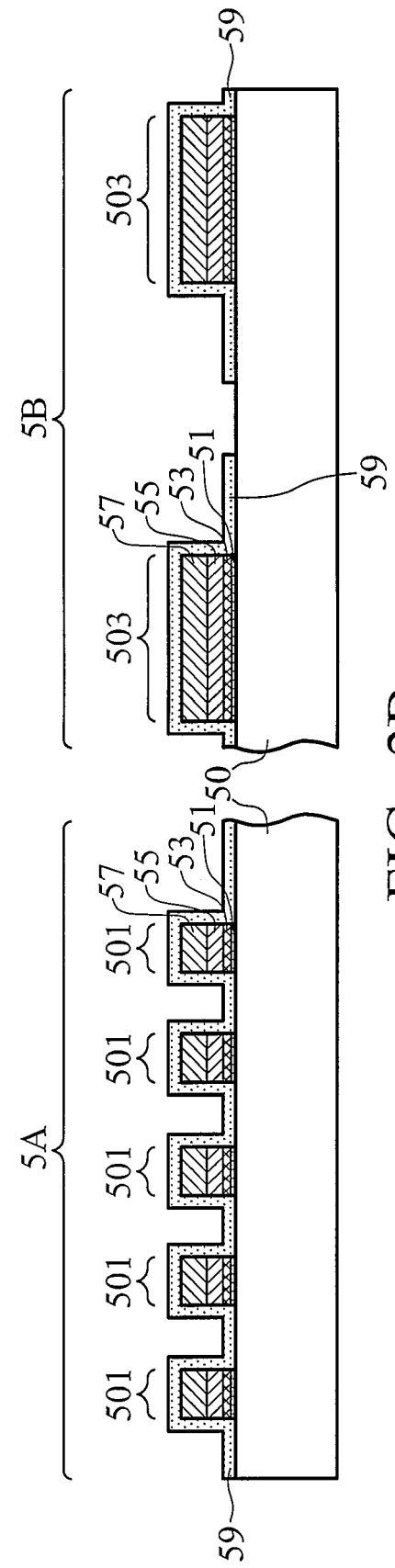

As shown in FIG. 2B, a silicon oxide layer 59 is comfortably deposited on the device region 5A and the ESD region 5B. The deposition source includes tetraethyl ortho silicate (TEOS), and the deposition can be processed by LPCVD. Different from the process in FIG. 1B, the example of the invention patterns the silicon oxide layer 59 in the ESD region 5B by the lithography process to expose part of the semiconductor substrate. The exposed part of the substrate 50 determines the contact area of a following formed plug and the substrate.

As shown in FIG. 2C, a sacrificial polysilicon layer 61 is blanketly formed on the described structure by CVD such as LPCVD. The sacrificial polysilicon layer 61 has a higher top surface than the conductive structures 501 and 503. After planarizing the sacrificial polysilicon layer 61 by CMP, a mask layer 63 is deposited thereon. The mask layer 63 can be silicon nitride formed by plasma enhanced CVD (PECVD). Subsequently, a patterned photoresist layer 65 is formed to selectively protect part of the sacrificial polysilicon layer 61 for the predetermined position of the later formed contact hole.

As shown in FIG. 2D, the mask layer 63 and the sacrificial polysilicon layer 61 not protected by the patterned photoresist layer 65 are then removed. The patterned photoresist layer 65 is then ashed. Removal of the mask layer 63 and the sacrificial polysilicon layer 61 is by anisotropic etching, including reactive ion etch (RIE) such as inductive coupled plasma RCE (ICP-RCE), high density plasma RIE (HDP-RIE), and the like. Ashing the photoresist layer 65 can be by general oxygen-containing plasma.

As shown in FIG. 2E, the mask layer 63 and silicon oxide layer 59 in lateral direction are removed by anisotropic etching as described above with a part of the mask layer 63 remaining and the silicon oxide layer 59 serve as side spacers of the conductive structures 501 and 503. Subsequently, a silicon oxide layer 67 is comfortably formed on the described structure. The formation and the material of the silicon oxide layers 59 and 67 can be similar.

As shown in FIG. 2F, an interlayer dielectric layer 69 is blanketly formed on the silicon oxide layer 67. The interlayer dielectric layer 69 is planarized until exposing the top surface of the sacrificial polysilicon layer 61. In general, the interlayer dielectric layer 69 includes borophosphosilicate glass (BPSG) or borosilicate glass (BSG) formed by CVD and then an anneal process. By removing the sacrificial polysilicon layer 61, the contact hole is formed, and by filling in the metal layer in the contact hole, the plug is formed. The sacrificial polysilicon layer 61 of the example is not directly removed; however, the sacrificial polysilicon layer 61 in the ESD region 5B is covered by a patterned photoresist layer 70. The patterned photoresist layer 70 should meet at least two requirements. First, the patterned photoresist layer 70 must totally cover the sacrificial polysilicon layer 61 in the ESD region 5B. Second, the patterned photoresist layer 70 should not cover any part of the sacrificial polysilicon layer 61 in the device region 5A. The patterned photoresist layer 70 should extend to the device region if these requirements are met. Because the critical dimension (hereinafter CD) of the patterned photoresist layer 70 is not high, low resolution lithography process and inexpensive negative type photoresist material can be applied to the invention to reduce costs.

As shown in FIG. 2G, a first removal process is performed to partially remove the sacrificial polysilicon layer 61 in the device region 5A. The removed part occupies ⅓ to ⅔ depth of the bit line contact hole 71. After ashing the patterned photoresist layer 70, the second removal process is performed to totally remove the remaining sacrificial polysilicon layer 61 in the device region 5A and partially remove the sacrificial polysilicon layer 61 in the ESD region 5B to form a trench. If the thickness of the remaining sacrificial polysilicon layer 61 in the device region 5A after the first removal process is thicker, than the thickness of the remaining sacrificial polysilicon layer 61 after the second removal process will be thinner. Alternatively, if the thickness of the remaining sacrificial polysilicon layer 61 in the device region 5A after first removal process is thinner, than the thickness of the remaining sacrificial polysilicon layer 61 after the second removal process will be thicker. In the embodiments of the invention, the height of the remaining sacrificial polysilicon layer 61 in the ESD region 5B occupies ⅓ to ⅔ depth of the contact hole 73. In one embodiment of the invention, the height of the remaining sacrificial polysilicon layer 61 in the ESD region 5B occupies a half depth of the contact hole 73.

As shown in FIG. 2H, a metal layer 75 is filled into the bit line contact hole 71 and upper portion of the contact hole 73 to form plugs 77 and 79 and covered on the interlayer dielectric layer 69. The metal layer 75, for example, includes tungsten. After planarized, the metal layer 75 is patterned to form bit lines. Because the layout of bit lines and word lines is not a feature of the invention and process and methods are well known in the art, it is omitted for brevity. Thus, the DRAM with an electrostatic discharge structure of the invention is completed.

Comparing the structures in FIGS. 1H and 2H, the embodiment of the invention has several benefits as follows. First, the plug 79 in the ESD region 5B has an upper portion of metal and a lower portion of polysilicon, thereby efficiently improving the mechanism strength of the ESD region. Next, the contact area between the bottom of the plug 79 and the substrate 50 can be controlled by the silicon oxide layer 59, such that the contact area is reduced without increasing aspect ratio of the plug. If the sacrificial polysilicon layer in the lower portion of the plug 79 is totally removed as shown in FIG. 1H, the silicon oxide layer 59 will be simultaneously removed. In brief, even if patterning is performed on the silicon dioxide layer 19 during a front end process in the comparative embodiment, the effect of controlling the contact area by the silicon dioxide layer 59 in the embodiment is still not achieved. Alternatively, the sacrificial polysilicon layer 61 serving as the lower portion of the plug 79 may rapidly release heat from electrostatic discharge, thereby preventing operating error caused by high temperatures. The described structure also shrinks the distance between the plug 79 and the conductive structure 503 and the distance between the plug 79 and the device region 5A, thereby reducing the ESD region 5B area. The bi-layer structure plug 79 can be completed by a low CD controlled patterned photoresist layer 70, such that the processes and equipments are substantially maintained without much adjustment.

While the invention has been described by way of embodiment and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an electrostatic discharge structure, comprising the steps of:
   providing a substrate having an electrostatic discharge region, wherein the electrostatic discharge region has a plurality of conductive structures;
   forming a patterned, conductive sacrificial layer on the substrate between two adjacent conductive structures;
   forming an interlayer dielectric layer over the substrate, wherein the interlayer dielectric layer encompasses the patterned, conductive sacrificial layer and exposes a top surface of the patterned, conductive sacrificial layer;
   partially removing the patterned, conductive sacrificial layer to form a lower portion of a plug; and
   filling a conductor into a contact hole wherein the conductor constitutes an upper portion of the plug to directly and electrically connected to the lower portion.

2. The method as claimed in claim 1 further comprising forming a collar insulator between the patterned, conductive sacrificial layer and the interlayer dielectric layer.

3. The method as claimed in claim 1, wherein each of the conductive structures comprises a gate dielectric layer, a metal silicide layer, a polysilicon layer, and a hard mask layer sequentially stacked on the substrate.

4. The method as claimed in claim 1 further comprising forming an insulating mask pattern situated directly under the patterned, conductive sacrificial layer, wherein the insulating mask pattern has an opening that defines a shrunk contact area of the plug.

5. An electrostatic discharge structure, comprising:
   a substrate having a plurality of conductive structures thereon;
   an interlayer dielectric layer formed on the substrate, wherein the interlayer dielectric layer has a contact hole between the conductive structures;
   a bi-layer plug embedded in the contact hole;
   an insulating mask pattern situated directly under the bi-layer plug, wherein the insulating mask pattern has an opening that defines a contact area of the bi-layer plug to the substrate.

6. The electrostatic discharge structure as claimed in claim 5, wherein the bi-layer plug comprises a polysilicon lower portion and a metal upper portion, and wherein the polysilicon lower portion fills into the opening.

7. The electrostatic discharge structure as claimed in claim 6 further comprising a collar insulator between the bi-layer plug and the interlayer dielectric layer.

* * * * *